United States Patent [19]

Vitiello et al.

[11] Patent Number: 4,918,404

[45] Date of Patent: Apr. 17, 1990

[54] PHASE LOCKED LOOP WITH SELF-ADJUSTING CIRCUIT FOR OSCILLATOR WORKING POINT

[75] Inventors: Paolo Vitiello, Rho; Luca Bergamo, Milan, both of Italy

[73] Assignee: Bull HN Information Systems Italia S.p.A., Milan, Italy

[21] Appl. No.: 248,004

[22] Filed: Sep. 22, 1988

[30] Foreign Application Priority Data

Dec. 18, 1987 [IT] Italy .................................. 23078 A/87

[51] Int. Cl.$^4$ ............................................. H03L 7/10
[52] U.S. Cl. ........................................ 331/11; 331/14; 331/16; 331/17
[58] Field of Search ....................... 331/10, 11, 12, 14, 331/16, 17, 25

[56] References Cited

U.S. PATENT DOCUMENTS

| 4,365,211 | 12/1982 | Lee | 331/11 |
| 4,814,725 | 3/1989 | Vitiello | 331/1 A |

FOREIGN PATENT DOCUMENTS 52-60052  5/1977  Japan ..................................... 331/11

OTHER PUBLICATIONS

European Patent Application No. 0 274 591, published 20.07.88 Bulletin 88/29.

Primary Examiner—Siegfried H. Grimm
Attorney, Agent, or Firm—Faith F. Driscoll; John S. Solakian

[57] ABSTRACT

A self-adjusting phase lock circuit including a frequency and/or phase comparator which compares the frequency and/or phase of a reference signal FVCO with the frequency and/or phase of a frequency or phase modulated signal RD generates an error signal which is applied as an input to an integrating network. The network generates an error voltage VC related to the frequency/phase error of the two signals which is applied to the control input of a voltage controlled oscillator operative to generate the reference signal FVCO as a function of the error voltage and of an adjusting voltage received at an adjusting input of the oscillator. Self-adjusting means is provided which includes a fixed reference voltage periodically applied as an input to the control input of the oscillator as a substitute for the error voltage and a source of a fixed frequency signal periodically applied as an input to the comparator as a substitute for the modulated signal RD. An operational network generates from the error voltage VC, a feedback signal (VRANGE) which is periodically applied to the adjusting input of the oscillator and held at said input by sample and hold circuits so that the adjusting voltage VRANGE is periodically adjusted automatically to maintain the phase lock circuit in an operative condition permanently close to a nominal working point independently of thermal drift and the performance spread of the components used.

5 Claims, 2 Drawing Sheets

PHASE LOCKED LOOP WITH SELF-ADJUSTING CIRCUIT FOR OSCILLATOR WORKING POINT

BACKGROUND OF THE INVENTION

1. Field of Use

The present invention relates to a self-adjusting phase lock circuit.

2. Prior Art

In order to recognize digital information read out from a magnetic media, typically a magnetic disk, phase lock circuits are used. When a magnetic media is read, it produces, through suitable reading circuits, a sequence of electrical pulses having a variable modulated frequency relative to a nominal frequency.

The modulated frequency has two components, a logical or meaningful modulation component and a noise modulation component caused by changes of the magnetic media as to a nominal speed. In order to recognize the read out data, it is required to discriminate between the logical and noise components. This is achieved by a phase lock circuit which basically comprises a phase comparator and discriminator, an integrating network and voltage controlled oscillator. The phase comparator and discriminator receive as inputs, the electrical read out pulses, and a periodic signal having a frequency locked to the basic actual frequency of the read out pulses. The phase comparator and discriminator provide as outputs, a logic data signal and one or more phase error signals.

The integrating network receives as inputs, the phase error signals, and outputs a variable voltage signal related to the error between the average frequency of the read out pulses and the frequency of the periodic reference signal. The voltage controlled oscillator (VCO) provides as an output, a signal whose frequency varies as a function of the variable voltage received at its control input.

The phase comparator, phase discriminator and the integrating network form a feedback frequency control system for the voltage controlled oscillator in which the control voltage for the oscillator consists of the voltage output produced by the integrating network. The controlled variable is the variable frequency signal output generated by the oscillator which is applied as an input to the phase comparator and discriminator. Both phase comparators as well as voltage controlled oscillators are available on the market in the form of integrated circuits, such as the types of integrated circuits manufactured by Signetics Corporation designated by code SCB58459 and by Texas Instruments Inc. designated by code SN74LS629.

The voltage controlled oscillator is a critical element of this control system. Its input voltage/output frequency characteristics are largely variable from product unit to product unit, and are further affected by temperature as well as by a range voltage "VRANGE" applied as an adjustment input. The value of VRANGE defines the proportionality coefficient which relates the control voltage to the output frequency.

To provide correct and reliable operation of the control system, it is necessary to define a predetermined nominal working point for the oscillator. In other words, independently of the component used, a predetermined output frequency must correspond to a predetermined input control voltage, centered in the permissible control voltage range. Further, the set point must not drift with temperature changes.

This is accomplished by means of suitable adjusting circuits comprising trimming resistors and positive temperature coefficient thermistors (PCT) which provide a range voltage VRANGE to the adjusting input suitable for each particular unit which varies with the temperature so as to compensate for spread and drift in the operation of the used component. The adjusting operation inherent with the use of trimmers negatively affects the manufacturing costs of the phase lock circuits. Further, it compensates only in part for thermal drift.

SUMMARY OF THE INVENTION

The above limitations are overcome by the self-adjusting phase lock circuit of the present invention in which the control circuit itself periodically generates and adjusts the range voltage as a function of the actual response of the component used. The invention provides circuit elements which enable the phase lock circuit to operate in a self-adjusting mode.

When the phase lock circuit is in self-adjusting mode, a predetermined voltage corresponding to the desired set point, is applied as an input to the control input of the oscillator and the output frequency is compared with a reference frequency which corresponds to a desired output frequency. An error signal is generated which modifies the range voltage input applied to the oscillator. This mode of operation may be periodically imposed at fixed time periods, or when the phase lock circuit is idle, in particular, for phase lock circuits working in magnetic disk units when the reading head is moving from one track to another. These and other features will appear more clearly from the description of the preferred embodiment when considered in connection with the following drawings.

DESCRIPTION OF THE PREFERRED EMBODIMENT

Figure 1:
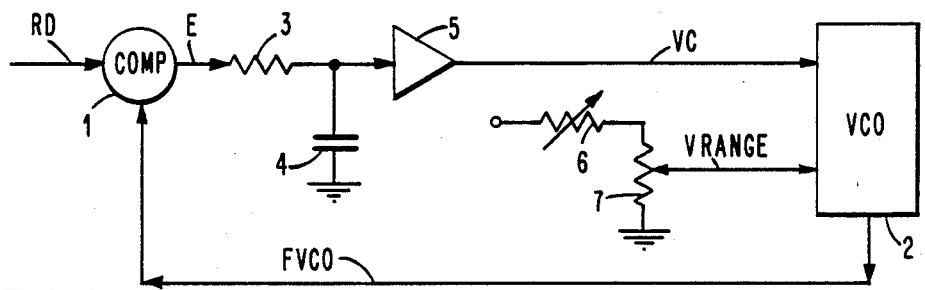
FIG. 1 shows in block diagram form, a prior art phase lock circuit.

FIG. 1 shows in block diagram form, a prior art phase lock circuit. The circuit comprises a frequency comparator 1, a voltage controlled oscillator 2, an integrating network consisting of a resistor 3 and a capacitor 4, a unit gain operational amplifier 5, a thermistor 6 and a voltage divider 7.

Comparator 1 receives as inputs, a frequency modulated signal RD consisting of a sequence of electrical pulses read out from a magnetic media, and a variable frequency square wave signal FVCO which is the output from oscillator 2. Although comparator 1 may be implemented in several ways, including analog circuits, digital comparators are preferable because of their intrinsic precision and stability.

The output of comparator 1 is an error signal E consisting of electrical pulses having alternatively, a level +V corresponding to the voltage supply of comparator 1 or level 0 whose duration varies as a function of the frequency error of the RD signal relative to input signal FVCO. When the two frequencies coincide, the output pulses at level +V have the same width as the output pulses at level 0. If the frequency of signal RD is greater than the frequency of signal FVCO, the pulses at level +V have a width greater than the one of the pulses at level 0 and vice versa if the frequency of signal RD is less than the frequency of signal FVCO. Some comparators produce as an output or at two distinct outputs, pulses at level +V or at level 0 in a mutually exclusive way, depending on whether the frequency of signal RD is greater or less than signal FVCO. The pulse width is generally proportional to the amount of error, but in some very simple comparators, the pulse width may be constant.

The effect of the error pulses applied to the input of the integrating network is to charge capacitor 4 to a variable voltage level. For example, if signals RD and FVCO have the same frequency, and the error pulses alternatively at level +V and 0 have the same width, the charge voltage of capacitor 4 is +V/2. If signal RD has a frequency greater than signal VFCO, the charge voltage will be greater than +V/2 and less if signal RD has a frequency less than signal FVCO. Voltage value +V/2 is the normal working point of the control system. It defines the operative conditions of the system when there is no error.

The charge voltage of capacitor 4, referenced as VC, is applied to the control input of voltage controlled oscillator 2 through unit gain operational amplifier 5. The only function of operational amplifier 5 is to decouple capacitor 4 from the relatively low input impedance of oscillator 2. In fact, an operational amplifier has a virtually infinite input impedance. As a consequence, it does not drain current from capacitor 4 and does not alter the electrical status of the integrating network.

The controlled oscillator 2 has characteristics which, by first approximation, are defined by the following equation:

$$FVCO = VC \cdot K1/(VRANGE-K2)$$

wherein:

FVCO is the output frequency of the oscillator;

VC is the input control voltage; that is, the charge voltage of capacitor 4;

K1 & K2 are parametric coefficients; and VRANGE is an adjusting voltage input applied to an adjusting input.

The voltage VRANGE is preferably obtained from a voltage divider 7 and a PCT thermistor 6 series connected between voltage source +V and ground. The output of voltage divider 7 is connected to the adjusting input of oscillator 2. The adjusting input may therefore receive a voltage whose value is between 0V and a voltage close to +V.

If coefficient K1 is an invariant characteristic of oscillator 2, no adjusting problem would arise. It would then be possible to define VRANGE as a fixed voltage which corresponds to a predetermined voltage VC which is equal to +V/2 and to define output frequency FVCO as being equal to the nominal value of the input frequency of signal RD. Unfortunately, coefficient K1 varies from unit component to unit component and further with temperature. An adjusting operation is therefore required in the manufacturing or maintenance of the described circuits. This implies, at a predetermined temperature, inputting a known reference frequency, FR, as a substitute for signal RD, such frequency corresponding to the nominal frequency RD, and adjusting of the position of the voltage divider 7 output, until the frequency of signal FVCO equals the reference frequency. This adjustment intrinsically causes VC=V/2. If not, a permanent offset of frequency FVCO from frequency FR would result.

The adjusting operation compensates for performance spreads of the oscillator components and assures a correct working point for the control system at the moment and in the adjustment environment. It does not assure that the set point is maintained over time and at differing temperatures. The use of a PCT thermistor compensates only in part for thermal drift.

Figure 2:
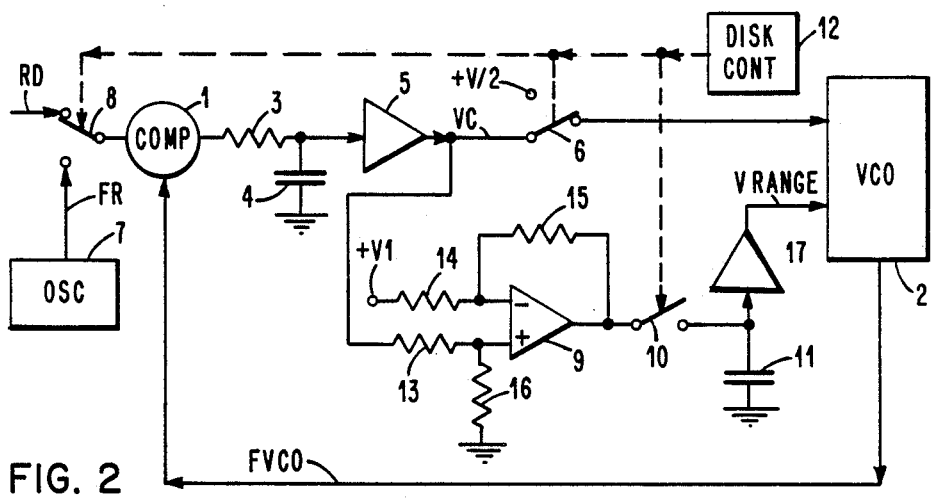
FIGS. 2 and 3 show in block diagram form, the self-adjusting phase lock circuit of the present invention operating in normal mode and in self-adjusting mode, respectively.
Figure 3:
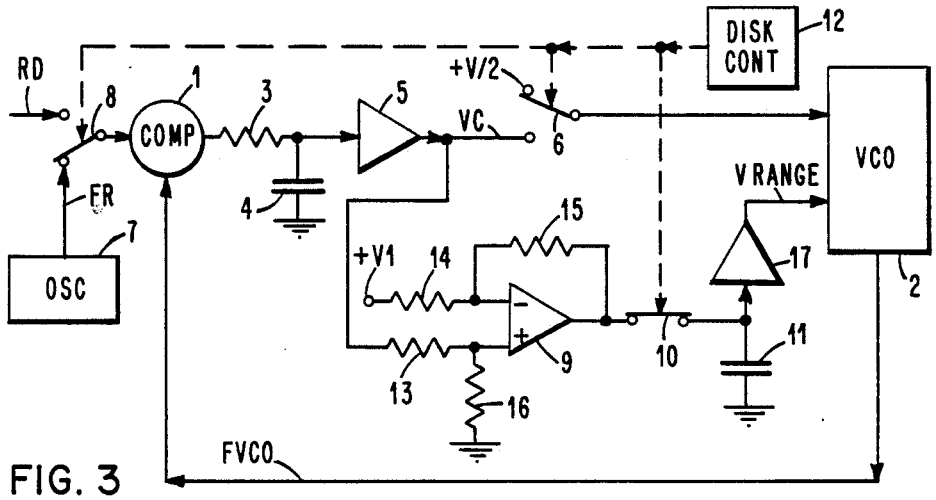

The above considerations will make it easier to understand the self-adjusting phase lock circuit which is the object of the present invention and whose block diagram is shown in FIGS. 2 and 3. FIGS. 2 and 3 show the same circuit in normal operating mode and in self-adjusting mode, respectively. The components, common to the prior art circuit of FIG. 1 and to the circuit of FIGS. 2 and 3, are indicated by the same reference numerals.

In addition to the frequency comparator 1, oscillator 2, resistor 3, capacitor 4 and amplifier 5 which connect as shown in FIG. 1, the circuit of FIG. 2 comprises an electronic switch or multiplexer 6, an oscillator 7 for the generation of a reference frequency VR, a second electronic switch 8, a second operational amplifier 9 which functions as a subtractor with gain, an electronic switch 10, a capacitor 11 and a third unit gain operational amplifier 17 used as a decoupling element. A disk unit controller 12 provides a control signal which, in normal operating read mode, maintains the switches 6, 8 and 10 in the positions shown in FIG. 2 and, in an operative adjustment mode, maintains the switches in the positions shown in FIG. 3.

Referring to FIG. 2, it can be seen that comparator 1 receives signal RD as input through switch 8 and that the capacitor 4 charge voltage VC is applied through amplifier 5 and switch 6 to the control input of oscillator 2. Voltage VC is further applied to the non-inverting (+) input of amplifier 9 through a resistor 13. The inverting (−) input of amplifier 9 is connected to a reference voltage V1 through a resistor 14.

For operation of the amplifier 9 as a subtractor with gain, a resistor 15 connects the inverting input to the output. The non-inverting input is connected to ground through resistor 16. The output of amplifier 9 in FIG. 2 is isolated due to open switch 10, while in FIG. 3, the output connects through closed switch 10 to capacitor 11 and the input of amplifier 17 whose output connects to the adjusting input of oscillator 2.

In the normal operative mode of FIG. 2, the phase lock circuit operates in the same way as the circuit of FIG. 1 with the only difference being that the voltage VRANGE applied to the input of oscillator 2 is the charge voltage of capacitor 11. FIG. 3 shows how voltage VRANGE is obtained in the self-adjusting mode of operation. In this mode, switch 6 connects the control input of oscillator 2 to a fixed voltage source +V/2 corresponding to the nominal working point or set point and switch 8 connects the input of comparator 1 to the output of oscillator 7.

Therefore, the integrating network produces a signal VC related to the error in frequency between signals FR and FVCO. Signal VC is applied as an input to amplifier 9 which applies as an output to capacitor 11 and to the adjusting input of oscillator 2 through closed switch 10, a voltage VRANGE. The voltage VRANGE is obtained according to the following transfer function:

$$VRANGE = (V1 - VC) \cdot K3$$

where K3 is a gain coefficient defined by the ratio between the value of feedback and biasing resistors 13 and 14 of amplifier 9. Values for K3 and V1 may be suitably chosen in relation to the voltage supply for components 1 and 2 and the admissible voltage range for voltage VRANGE. For integrated circuits powered from a +5V source and with an admissible voltage range between 0V and +5V for voltage VRANGE, a suitable choice is V1 = +3V and K3=5. In this way, for a drift of VC around the working point +V/2=2.5, the value for V1 is between 2 and 3 volts, while voltage VRANGE spans from +5V to 0V.

The control loop so formed provides a voltage VRANGE to load capacitor 11 and to the adjusting input of oscillator 2. This establishes a stable state in which the offset of voltage VC from the set point, as well as the offset of signal FVCO from the reference frequency FR, is minimized. When switching from the adjusting mode to the normal operating mode, the opening of switch 10 does not change the charge status of capacitor 11, and the voltage VRANGE previously applied as an input to oscillator 2 is maintained. By suitably selecting the capacitance of capacitor 11 in the order of 100 nf, the charge level is maintained substantially unchanged for periods in the order of hundreds of msec. This is because the input impedance of amplifier 17 is virtually infinite.

It is clear that a circuit like the one described provides a self-adjustment which is periodically renewed every time it is switched from normal operating mode to adjustment mode. Therefore, if, in the course of time, a thermal drift of components occurs, or there is a change in the component response, the circuit automatically provides a change to voltage VRANGE so as to establish a working point which differs from the nominal point by a minimal amount.

Having described in conceptual and schematic terms, a self-adjusting phase lock circuit in accordance with the invention, a preferred form of embodiment will now be described with reference to FIG. 4. The preferred embodiment makes use of circuit components easily available on the market and provides some circuit simplification. The related description is further useful to point out some of the several constructive changes which can be made.

Figure 4:
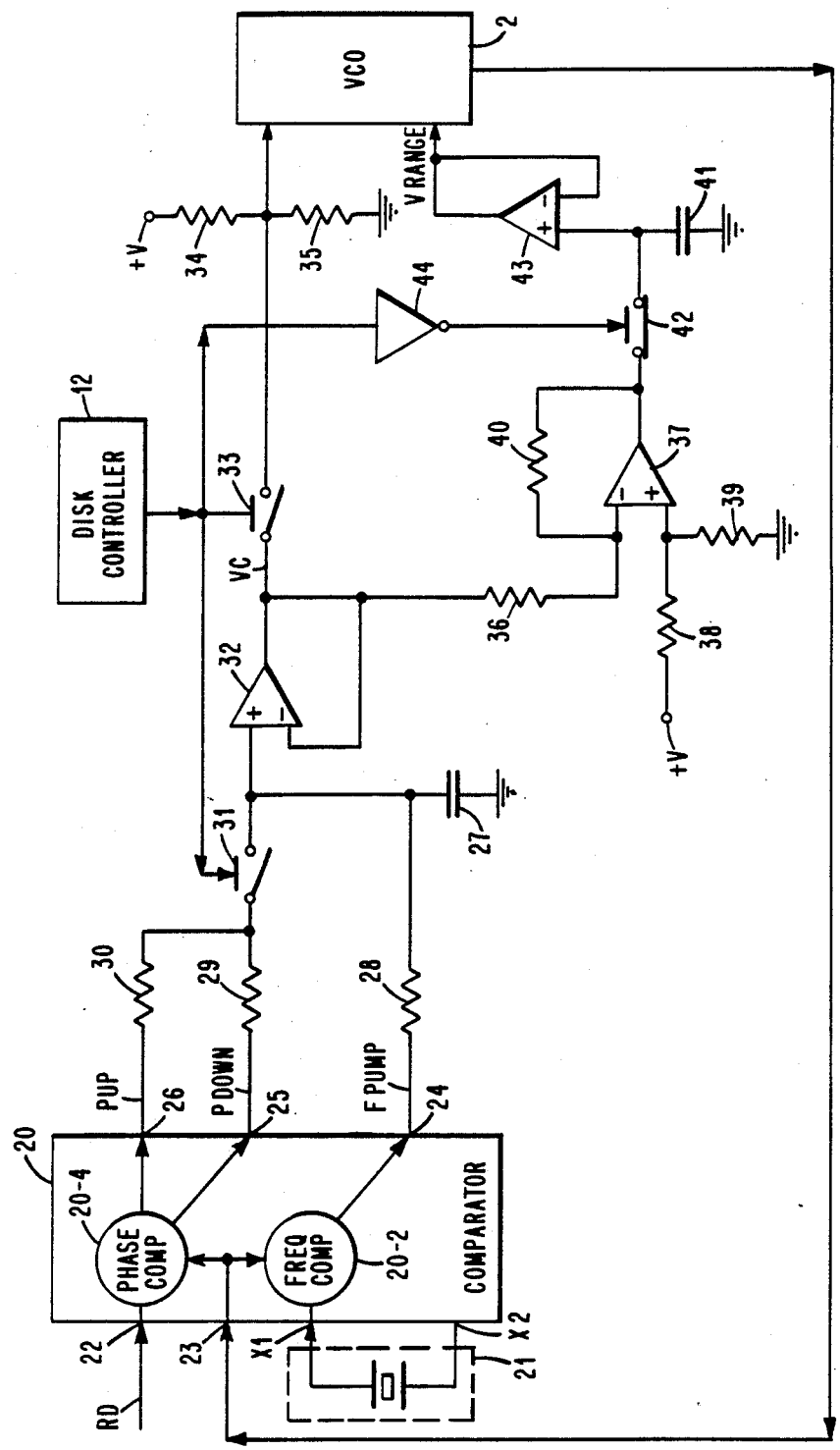
FIG. 4 shows a preferred embodiment of the self-adjusting phase lock circuit of the present invention.

In FIG. 4, the phase lock circuit comprises a comparator/discriminator 20 consisting of an integrated circuit SCB68459, and a controlled oscillator 2 consisting of integrated circuit 74LS629, already mentioned. Comparator 20 has two inputs X1 and X2 for connection to an external oscillator 21 which produces a reference signal FR having a frequency twice the nominal working frequency; that is, the nominal frequency of read signal RD.

Comparator 20 receives signal RD at an input 22 and signal FVCO at an input 23. Circuit 20 comprises two distinct comparators 20-2 and 20-4. The first frequency comparator 20-2 compares the frequency of signal FR to the frequency of signal FVCO. The voltage controlled oscillator 2 is set to operate at a frequency which is twice the nominal working frequency of signal RD and provides at output 24, a signal FPUMP which periodically and alternatively rises to +5V for the width of signal FR and drops to 0V for the width of signal FVCO.

The second phase comparator 20-4 compares the phase of signal RD to the phase of signal FVCO and provides at output 26, a periodic signal PUP at level +5V whose width is equal to the phase lag of signal RD relative to signal FVCO, and at output 25, a periodical signal PDOWN at level 0V whose fixed width is equal to the half period of FVCO if signal RD leads relative to signal FVCO. In other words, as already mentioned, a plurality of error pulse signals is generated on distinct outputs. Output 24 is connected to a first terminal of a capacitor 27 through a resistor 28. The second terminal of capacitor 27 is grounded. Output 25 is connected to the first terminal of capacitor 27 through a resistor 29 which connects in series with an electronic switch 31. Output 26 is connected to the first terminal of capacitor 27 through a resistor 30 which connects in series with the electronic switch 31.

Resistors 28, 29 and 30 and capacitor 27 collectively form an integrating network in which signal PUP tends to charge capacitor 27, signal PDOWN tends to discharge capacitor 27, and signal FPUMP tends to charge or discharge capacitor 27 depending on whether the frequency of signal FVCO is less or greater than the frequency of signal FR. When switch 31 is closed, capacitor 27 is charged at a voltage level related to the phase error of signal RD relative to signal FVCO which is corrected as a function of the frequency error of signal FVCO relative to signal FR. When switch 31 is open, capacitor 27 is powered only by signal FPUMP and is charged at a voltage level related to the frequency error of signal FVCO relative to signal FR.

The first terminal of capacitor 27 is connected to the non-inverting input of operational amplifier 32 which operates as a voltage follower with high input impedance, hence, as a simple decoupler. The output of amplifier 32 is connected to the control input of oscillator 2 through electronic switch 33. The control input of oscillator 2 is further connected to voltage source +V=5V through resistor 34 which has a relatively high value (51 kilohms) and to ground through a resistor 35 having the same value as resistor 34.

When switch 33 is closed, the control voltage input to oscillator 2 is substantially the charge voltage VC of capacitor 27, because the output impedance of amplifier 32, when added to the internal resistance of analog switch 33, is in the order of 100 ohms which is much lower than the value of resistors 34 and 35. When the switch 33 is open providing a virtually infinite resistance (10 megohms), the control input of oscillator 2 is biased with a fixed reference voltage equal to +V/2=2.5V.

The output of amplifier 32 is connected to the inverting input of operational amplifier 37 through a resistor 36. The non-inverting input of amplifier 37 is connected to the voltage source +V through a resistor 38 and to ground through a resistor 39. A feedback resistor 40 connects the output to the inverting input.

For a value of resistors 36 and 38 equal to 56 kilohms, and a value of resistors 40 and 39 equal to 100 kilohms, the transfer function of the amplifier is:

VOUT=(+V−VC).100/56.

This provides a gain slightly less than 2. Therefore, for a change in voltage VC between 2.46V and 5V, VOUT spans from 0 to 5V.

The output of operational amplifier 37 is connected to the first terminal of a capacitor 41 through an electronic switch 42. The second terminal of capacitor 41 is grounded. The first terminal is further connected through a unit gain operational amplifier 43 to the adjusting input of controlled oscillator 2.

Electronic switches 31, 33 and 42 are, for instance, analog switches manufactured by National Semiconductor Corp., designated by code MM74HC4066. The operational amplifiers may be amplifiers manufactured by National Semiconductor Corp., designated by code LF347. A disk control unit 43 provides signal CTR to switches 31 and 33. When signal CTR =5V (nominal), the switches are closed, and when signal CTR=0V (nominal), the switches are open. Signal CTR is also applied through inverter 44 to the control input of switch 42.

It is clear that the operation of the circuit shown in FIG. 4 is quite similar to one of the circuits shown in FIGS. 2 and 3, even if there is some difference in the circuit embodiment, such as the use of electronic switches instead of toggle switches, the direct use of the powering voltage for the operational amplifier 37, the permanent connection of the control input of oscillator 2 to a reference voltage VR which is overriden by voltage VC when switch 33 is closed, and the use of two distinct comparators included in the integrated circuit 20 for comparing signal RD with signal FVCO and signal FR with signal FVCO. All these differences make clear that several changes can be made in the embodiment of the self-adjusting phase lock circuit of the invention which has been described only with reference to a block diagram and to a preferred embodiment.

In particular, the circuit of the present invention may incorporate, in whole or in part, the circuit refinements disclosed in European Patent Application No. 0274591, published July 20, 1988 and corresponding to U.S. Pat. No. 4,814,725 aimed at increasing circuit performance, with the due regard that some of these requirements are superfluous in the context of the present invention.

What is claimed is:

1. A self-adjusting phase lock circuit which comprises first means for comparing the frequency and/or the phase of a reference frequency signal to a variable frequency periodic input signal and generating an error voltage related to the differences in frequency and/or phase between said signals and further comprising a voltage controlled oscillator having a controlled input and an adjusting input for receiving said error voltage and an adjusting voltage respectively, said oscillator generating said reference frequency signal as a function of said error and adjusting voltages, and wherein said phase lock circuit further comprises:
    second means for decoupling said error voltage from said control input and for applying a predetermined reference voltage to said control input of said oscillator;
    third means for comparing the frequency of said reference frequency signal to a nominal working frequency signal to generate a voltage related to the error between said working frequency signal and the frequency of said reference frequency signal;
    fourth means coupled to said third means operative in response to said voltage generated by said third means for generating said adjusting voltage;
    fifth means coupled to said fourth means for sampling and holding said adjusting voltage;
    sixth high input impedance means coupled to said fifth means for applying said voltage to said adjusting input of said oscillator;
    seventh means coupled to synchronously control said second and fifth means respectively to decouple said error voltage and to sample said adjusting voltage; and,
    said third, fourth, fifth, sixth means and said oscillator being connected to form a feedback control loop for controlling the frequency of said reference frequency signal by feeding back said adjusting voltage.

2. The phase lock circuit of claim 1 wherein said third means includes said first means and further includes eighth means for substituting said nominal working frequency for said variable frequency periodical input signal as an input to said first means.

3. The phase lock circuit of claim 1 wherein said first means comprises:
    a phase comparator for comparing the phase of said reference frequency signal with the phase of said periodical input signal and for generating at least a first phase error signal;
    a frequency comparator for comparing the frequency of said nominal working frequency with the frequency of said reference frequency signal and for generating a frequency error signal; and
    an integrating network coupled to receive said first phase error signal and said frequency error signal and generate said error voltage relative to said differences in phase and frequency.

4. The phase lock circuit of claim 3 wherein second means for decoupling includes:
    a first analog switch and a voltage divider connected to the output of said first switch;
    said third means comprising said frequency comparator, said integrating network and a second analog switch for decoupling said first phase error signal as an input to said integrating network;
    said fourth means comprising a first operational amplifier for performing a subtraction with gain operation on the voltage generated by said third means relative to a reference voltage; and,
    said fifth means comprising a third analog switch connected to the output of said first operational amplifier and a capacitor connected between the output of said third switch and ground reference potential.

5. The phase lock circuit of claim 1 wherein said fourth means includes biasing and feedback means, said oscillator connects to a voltage supply and said adjusting voltage VR is generated in response to said error voltage VC from said first means according to the following equation:

$$VR=(V1-VC)\cdot K3$$

wherein V1 is a fixed voltage selected relative to said voltage supply and K3 is a gain coefficient defined by the ratio of the amount of feedback and biasing provided by said biasing and feedback means of said fourth means.

* * * * *